United States Patent
Schneider et al.

(10) Patent No.: US 6,326,639 B1
(45) Date of Patent: Dec. 4, 2001

(54) HETEROSTRUCTURE SEMICONDUCTOR RADIATION DETECTOR FOR WAVELENGTHS FROM THE INFRARED SPECTRAL RANGE

(75) Inventors: Harald Schneider, Gundelfingen; Martin Walter, Ebringen, both of (DE)

(73) Assignee: Fraunhofer-Gesellschaft zur Forderung der Angewandten Forschung E.V., Munich (DE)

( * ) Notice: Subject to any disclaimer, the term of this patent is extended or adjusted under 35 U.S.C. 154(b) by 0 days.

(21) Appl. No.: 09/381,201
(22) PCT Filed: Mar. 19, 1998
(86) PCT No.: PCT/EP98/01623
§ 371 Date: Sep. 17, 1999
§ 102(e) Date: Sep. 17, 1999
(87) PCT Pub. No.: WO98/42028
PCT Pub. Date: Sep. 24, 1998

(30) Foreign Application Priority Data

Mar. 19, 1997 (DE) .............................. 197 11 505

(51) Int. Cl.[7] .......................... H01L 29/06; H01L 31/072; H01L 31/109; H01L 31/0328; H01L 31/0336
(52) U.S. Cl. .................. 257/17; 257/21; 257/22; 257/25; 257/184; 438/93; 438/94
(58) Field of Search ................... 257/21, 17, 22, 257/25, 184; 438/93, 94

(56) References Cited

U.S. PATENT DOCUMENTS

| | | | |
|---|---|---|---|
| 4,903,101 | * | 2/1990 | Maserjian .............................. 357/30 |
| 5,036,371 | * | 7/1991 | Schwartz ................................ 357/16 |
| 5,077,466 | * | 12/1991 | Delacourt et al. ................. 250/211 J |
| 5,079,601 | * | 1/1992 | Esaki et al. .............................. 357/4 |
| 5,185,647 | * | 2/1993 | Vasquez ................................. 257/17 |
| 5,521,398 | * | 5/1996 | Pelekanos et al. .................... 257/17 |
| 5,563,423 | * | 10/1996 | Wu et al. ............................... 257/21 |
| 5,978,399 | * | 11/1999 | Doughty ................................ 372/45 |

FOREIGN PATENT DOCUMENTS

403123087 * 5/1991 (JP) ........................................ 257/21

* cited by examiner

*Primary Examiner*—William Mintel
(74) *Attorney, Agent, or Firm*—Antonelli, Terry, Stout & Kraus, LLP

(57) ABSTRACT

The present invention relates to a semiconductor heterostructure radiation detector for wavelengths in the infrared spectral range. The semiconductor heterostructure radiation detector is provided with an active layer composed of a multiplicity of periodically recurring single-layer systems each provided with a potential well structure having at least one quantum well with subbands (quantum well), the so-called excitation zone, which is connected on one side to a tunnel barrier zone, whose potential adjacent to the excitation zone is higher than the band-edge energy of a drift zone adjoining on the other side of the potential-well structure. The invention is characterized in that said drift zone is adjacent to a trap zone which is provided with at least one quantum-well structure containing subbands and is connected to the tunnel barrier zone of another single-layer system immediately adjacent in periodic sequence comprising an excitation zone, a drift zone, trap zone and a tunnel barrier zone, that the energy levels of said subbands of said quantum-well structures inside said excitation zone and said trap zone as well as the thickness of said tunnel barrier zone are set in such a manner that there is sufficient tunneling probability for the charge carriers to tunnel from the trap zone through the tunnel barrier zone into the excitation zone.

24 Claims, 2 Drawing Sheets

HETEROSTRUCTURE SEMICONDUCTOR RADIATION DETECTOR FOR WAVELENGTHS FROM THE INFRARED SPECTRAL RANGE

TECHNICAL FIELD

The present invention relates to a semiconductor hetereostructure radiation detector for wavelengths in the infrared spectral range. The semiconductor heterostructure radiation detector is provided with an active layer composed of a multiplicity of periodically recurring single-layer systems each provided with a potential well structure having at least one quantum well with subbands (quantum well), the so-called excitation zone, which is connected on one side to a tunnel barrier zone, whose potential adjacent to the excitation zone is higher than the band-edge energy of a drift zone adjoining on the other side of the potential-well structure.

STATE OF THE ART

Photodetectors of the aforementioned type are a special sort of quantum-well intersubband photodetectors, abbreviated QWIP. The QWIP structures usually employed are photoconductors, whereas the aforedescribed detectors have photovoltaic properties, i.e. upon illumination, the detector structure generates a photocurrent inside the detector without application of external electrical voltage to the detector. Detectors having such photoresistive photovoltaic properties have the special advantage that they are not subject to any generation recombination noise in the unilluminated state, because no dark current flows in them. This permits, in particular, the production of detectors with very large dynamic properties.

A typical representative of such a quantum-well intersubband photodetector optimized for detection of infrared waves is described in DE 42 20 620 C1. The presented quantum-well intersubband infrared photodetector is provided with a multiplicity of quantum wells which are spatially separated by wide barrier layers. With respective doping, each single quantum well has an asymmetric potential course resulting in the creation of tunnel barriers at both ends of the barrier layer and form electronic conditions inside it, permitting in this manner the selective rerelaxation of the charge carriers excited in the barrier region. These carriers form a photocurrent without application of an external voltage to the layer sequence.

H. Schneider et al.'s article "Transport Asymmetry and Photovoltaic Response in (AlGa)As/AlAs/GaAs/(AlGa)As Single-Barrier Quantum-Well Infrared Detectors" Appl. Phys. Lett. 60(12), Mar. 23, 1992, pp. 1471 to 1473, describes QWIP structures whose active detector layer is composed of a periodic sequence of a so-called absorption zone, a tunnel barrier zone and a drift zone. The essential feature of these state-of-the-art structures is that the potential edge of the tunnel barrier zone is higher than the drift zone so that the charge carriers, raised from the absorption zone by optical excitation, cannot propagate in the direction of the immediately adjacent tunnel barrier zone but rather go in the opposite direction via the drift zone. According to the authors, this asymmetric transport mechanism is composed of the asymmetric potential courses and the scatter processes at the transition regions. The charge carriers migrating in the direction of the drift zone reach the tunnel barrier zone of the next layer sequence through which the charge carriers tunnel into the absorption zone.

C. Sirtori et al's article "Photocurrent Reversal Induced by Localized Continuum Resonances in Asymmetric Quantum Semiconductor Structures', Appl. Phys. Lett. 63, S. 2670 (1993) describes the use of a multiplicity of quantum-well structures each provided with different potential well widths.

Although all the aforedescribed photovoltaic detectors have the advantage that they are subject to substantially less noise than conventional photoconducting detectors, because they generate no dark current due to the fact that no external voltage is applied, as already mentioned in the preceding. Johnson noise is also extremely low due to the very great impedance of the detectors. As a photocurrent flows in the present detector structures although no voltage is applied, thus there is a resistive—not only—a capacitive coupling. Detector arrays of this detector type are very compatible with readout electronic devices, such as those used for InSb respectively HgCdTe detectors.

However, the state-of-the-art photovoltaic detectors have the disadvantage that they are much less sensitive than the conventional detectors operating with an external supply voltage.

DESCRIPTION OF THE INVENTION

For this reason, the present invention provides an improved semiconductor heterostructure radiation detectors, generically based on the photovoltaic principle, in such a manner that detection sensitivity is improved.

The present invention is based on the further development of a state-of-the-art semiconductor heterostructure radiation detector which is provided with a layer that is active for the detection of wavelengths in the infrared spectral range. This layer, which is active for the detection of wavelengths in the infrared range, is composed of a multiplicity of periodically recurring single-layer systems. The single-layer systems each have a potential structure having at least one quantum well with subbands, the so-called quantum well, hereinafter referred to as the excitation zone. The quantum well is connected on one side to a tunnel barrier zone whose potential adjacent to the excitation zone is higher than the band-edge energy of a drift zone adjacent on the other side of the potential- well structure. Such a layer system is, as already described in the preceding, also known as a "single-barrier well" structure.

An element of the present invention is that the state-of-the-art structure is further developed in that the drift zone is adjacent to a trap zone provided with at least one subband-containing quantum-well structure and is connected to a tunnel-barrier zone of another periodically recurring single-layer system. Another element of the present invention is that the energy levels of the subbands of the quantum-well structures inside the excitation and trap zone and the thickness of the tunnel barrier zone are dimensioned in such a manner that there is sufficient tunnel probability for the charge carriers to tunnel from the trap zone through the tunnel barrier zone into the excitation zone.

BRIEF DESCRIPTION OF THE DRAWING

In order to make the present invention more apparent, reference is made to the following drawings showing preferred embodiments of the invention without limiting the scope or spirit of the invention.

DESCRIPTION OF THE PREFERRED EMBODIMENTS

Figure 1:
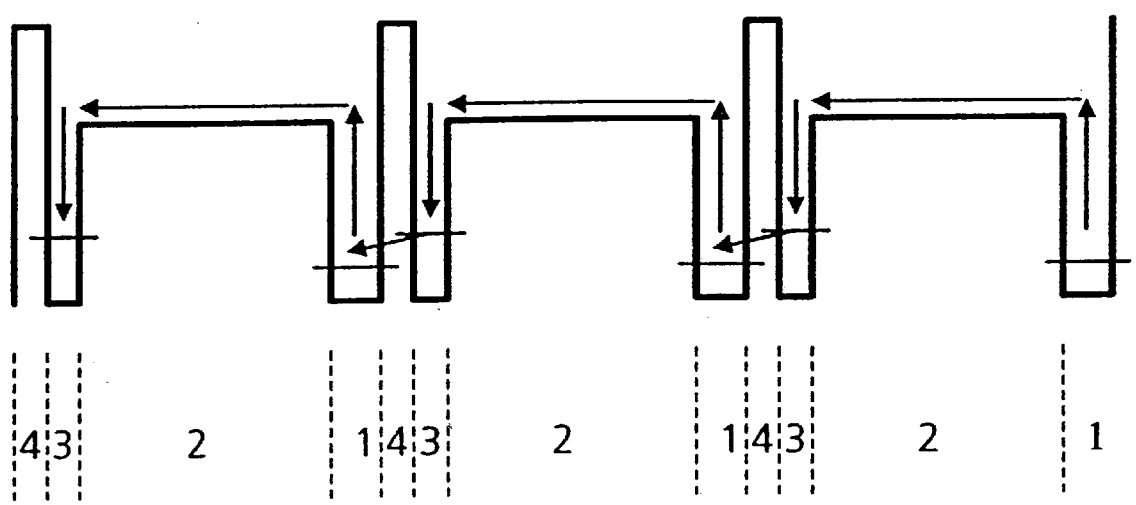
FIG. 1 illustrates the band pattern of a single-layer system constructed according to the present invention comprising an excitation zone, a drift zone, a trap zone and a tunnel barrier zone, FIGS. 2a, and b illustrate a potential course and the calculated wave functions of a QWIP structure according to the preferred embodiment of FIG. 1 and a QWIP structure having a double quantum-well structure in the trap zone.

FIG. 1 shows a diagram of the potential course of the active layer containing details of three periodically recurring single-layer systems of a semiconductor heterostructure radiation detector constructed according to the present invention. The preferred embodiment shows a simple layer arrangement comprising four single adjacent zones.

In the following, the charge carrier transport mechanism is described using the preferred embodiment shown in FIG. 1.

In excitation zone 1, which in this instance is a simple quantum well, the charge carriers are optically excited due to which they are raised into the quasi-continuum above the band-edge energy of the drift zone 2 immediately adjacent to excitation zone 1. A photocurrent is generated without application of an external electric voltage by the excited charge carriers passing through drift zone 2 into trap zone 3. Like in the state-of-the-art "single-barrier well" structures, the photocurrent is selective, because the charge carriers optically excited in the excitation zone cannot tunnel right through tunnel barrier zone 4. Nonetheless, the charge carriers in respective subbands in trap zone 3 are able to tunnel through tunnel barrier zone 4 and occupy the quantum well located in the adjacent excitation zone 1.

In order to generate the desired selective photocurrent, it is necessary to ensure that the tunneling process proceeds sufficiently quickly so that the charge carriers relaxing into trap zone 3 do not get back to the original excitation zone 1 from trap zone 3 via drift zone 2 due to thermal reemission processes. Moreover, the potential course of the tunnel barrier zone 4 has to be arranged in such a manner that the charge carriers excited in excitation zone 1 do not immediately get through the tunnel barrier wall into the adjacent trap zone 3.

It has also proven to be especially advantageous that a charge carrier density of typically $10^{11}$ to $10^{12}$ charge carriers per square centimeter is provided in excitation zone 1. This charge carrier density can be obtained by suitably n-doping the entire excitation zone 1 or one respectively several sections of excitation zone 1. In addition or as an alternative it is also possible to dope the layer regions adjacent to the excitation zone 1 preferably in the course of modulation doping. The following embodiments concentrate on n-doping of the excitation zone and therefore the photoabsorption process is limited to excitation of electrons, however, p-doping of the excitation zone and the adjacent zones is just as possible, whereby the detection process occurs by excitation of holes.

Except in the event of modulation doping in the layer regions adjacent to excitation zone 1, the drift-trap zone and/or the tunnel barrier zone are preferably left undoped.

Based on the single-layer system structures shown in FIG. 1, a radiation detector in accordance with the invention was fabricated according to the following specifications: the active layer of the radiation detector is composed of 20 periodically recurring single-layer systems produced with the aid of as such known epitaxy processes. Trap zone 3 forms a 3.6 nm thick Ga/As layer adjacent to a 45 nm thick drift zone composed of $Al_{0.24}Ga_{0.76}As$. The excitation zone adjacent to drift zone 2 is composed of a 4.8 nm thick GaAs layer. On the other hand, the tunnel barrier zone has a layer sequence of 3.6 nm $Al_{0.24}Ga_{0.76}As$, 0.6 nm AlAs, 1.8 nm $Al_{0.24}Ga_{0.76}As$ and 0.6 nm AlAs.

The trap zone composed of a 4.8 nm thick GaAs layer is n-doped with a charge carrier area concentration of $4\times10^{11}cm^{-2}$. The active layer of the detector composed of single-layer systems is quasi a sandwich structure between two contact layers composed of silicon doped GaAs having an n-doped content of $1.0\times10^{18}cm^{-3}$.

However, in addition to the aforedescribed preferred embodiment with the material system GaAs/AlGaAs, layer systems with other material systems are possible, such as for example InGaAs/GaAs, InGaAs/AlGaAs as well as InGaAs/InAlAs/InP.

Figure 2:
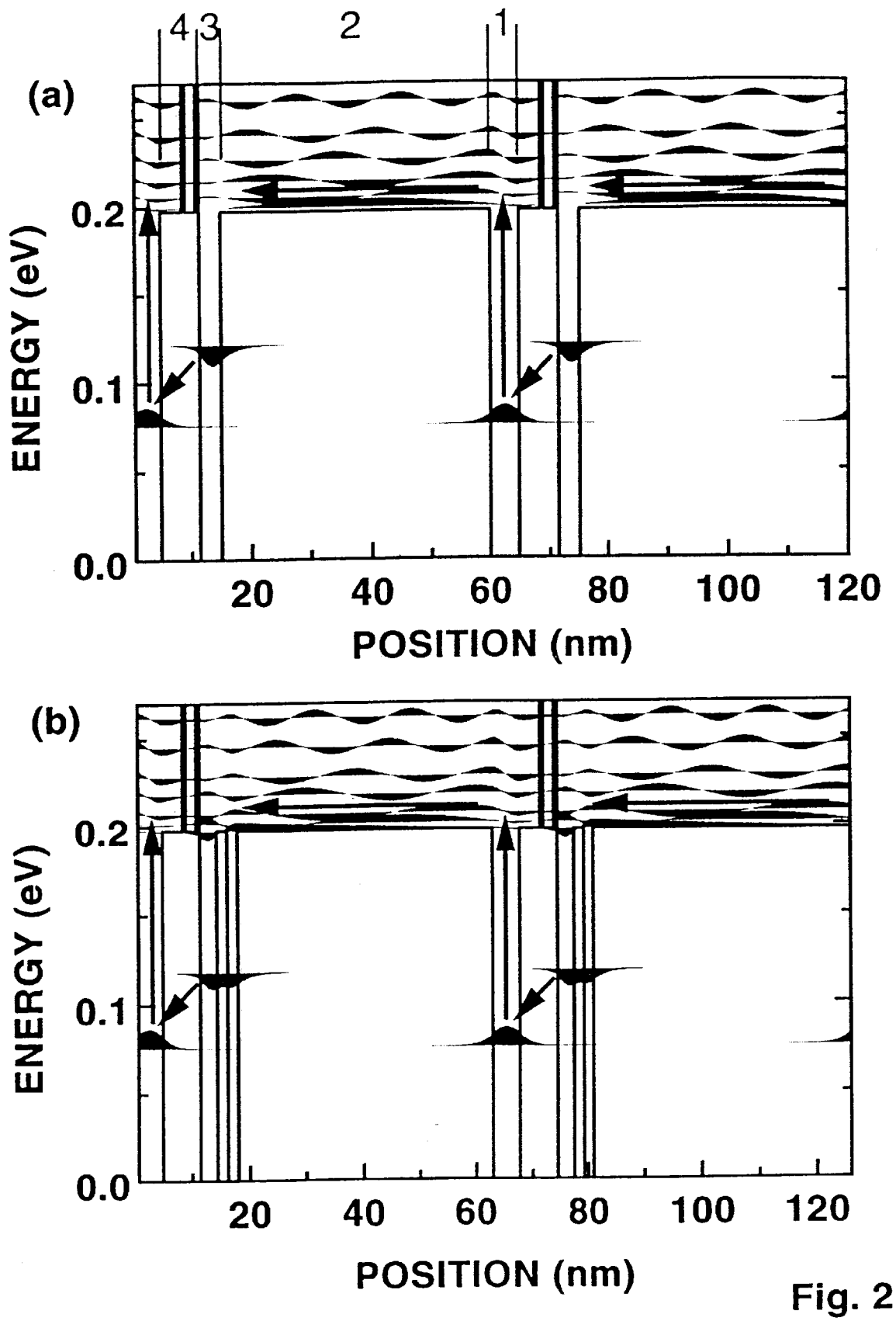

Using the aforedescribed preferred embodiment of an invented semiconductor heterostructure radiation detector in accordance with the invention, reference is made to FIG. 2a showing the potential course of the single-layer systems as well as the course of the calculated wave functions of the charge carriers.

FIG. 2a shows that the tunnel barrier zone 4 has two raised potential peaks each resulting from the aforedescribed AlAs layers. The purpose of these two potential peaks is to considerably reduce the tunnel probability of the charge carriers raised from the excitation zone 1 by optical excitation into the free energy continuum and possibly being able to pass through tunnel barrier zone 4 via the tunneling process. In this manner, the excited charge carriers reach trap zone 3 via drift zone 2. Furthermore, it is advantageous to place at least one subband as deeply as possible inside the quantum-well structure so that relaxed charge carriers cannot be raised again by thermal excitation out of the respective potential well onto this subband, of which FIG. 2a only shows one representative of the subbands with the respective wave function. Moreover, care must be taken that the energy position of these deep subbands is located above the ground state of the potential well of the excitation zone. Tunneling through tunnel barrier zone 1 thus occurs onto the subbands which lie energetically deeper in the excitation zone 1 as the arrows in FIG. 2a show.

In order to prevent the charge carriers excited in excitation zone 1 from being quasi reflected at the tunnel barrier zone 4 without relaxing into trap zone 3 after passing through drift zone 2 and returning in the opposite direction to the original excitation zone 1, i.e. counter to the photocurrent, the quantum-well structure of trap zone 3 has to be provided in such a manner that at least one subband or a continuum resonance is provided at energy levels in the vicinity of the band edge energy of drift zone 2 in such a manner that the occurrence probability of charge carries having these energies in the region of the trap zone 3 is maximized. In addition to or as an alternative to the preceding dimensioning of such subbands, subbands can also optimize the trap process of the charge carriers in the trap zone if subbands in the range of an optical phonon energy below the band edge energy of drift zone 2 are provided in the potential well of the trap zone.

In order to maximize detection sensitivity, the layer thickness of the quantum-well structure inside the excitation zone 1 has to be dimensioned in such a manner that at least one subband or a continuum resonance is present at energies in the vicinity of the band edge energy of drift zone 2 so that the oscillator power is maximized for optical transitions into free end states.

In addition to being able to build the excitation and trap zone as a single potential well, these zones can be preferably also be provided as double, multiple quantum-well structures or as a super lattice.

FIG. 2b shows the potential course and the calculated wave functions of photovoltaic QWIP structure in accordance with the invention in which one double quantum-well structure is provided in each trap zone. The double sequence or two closely coupled potential wells inside trap zone 3 results in a raised trap probability also due to their greater width. FIG. 2b shows, different than FIG. 2a, that there is increased state density of the wave function inside the trap zone in the vicinity of the band edge of drift zone 2 which also increases trap probability in this zone. The preferred embodiment depicted in FIG. 2b is a double quantum-well structure composed of GaAs-Al$_{0.24}$Ga$_{0.76}$As-GaAs in trap zone 3. Tunnel barrier zone 4 is composed of a Al$_{0.24}$Ga$_{0.76}$As-AlAs-Al$_{0.24}$Ga$_{0.76}$As-AlAs heterostructure.

By structuring the individual zones in this manner, detectability, detection wavelengths, spectral course, responsiveness and temporal behavior, just to name some of the properties of the detector, are selectively influenced.

The active layer of the heterostructure semiconductor radiation detector of the present invention usually is composed of 1 to 100 periodic sequences of the single layer of the present invention and is provided above and below the layer structure respectively with doped layers for electric contacting. It is particularly preferred if additional tunnel barrier zones are inserted at the edges of the active layer in order to improve the linearity of the detectors.

The buildup of a semiconductor heterostructure radiation detector of the invention described in the preceding shows that the responsiveness, i.e. the response behavior is improved by optimizing the trap zone.

A tripled responsiveness was observed with the detector structure illustrated in FIG. 2b relative to the structure of FIG. 2a.

This was achieved, in particular, by employing a double quantum-well structure in the trap zone. Thereby also leading to very high detectability of the similar value as that of a conventional photoconductive QWIP structure.

Due to the particular low noise level of the detectors, the photovoltaic detectors built according to the present invention are of particular interest for so-called focal plane array camera systems, because they have no dark current and reach increased detectiveness with small photocurrents. Both properties lead to greatly reduced current levels compared to conventional photoconductive quantum-well inter-subband phototodetectors, and therefore to a greater maximum integration time and to reduced cooling power. Such detectors also find use in uncooled monitor detectors for long infrared lasers.

What is claimed is:

1. A semiconductor heterostructure radiation detector for wavelengths in the infrared spectral range provided with an active layer comprising of a multiplicity of periodically recurring single-layer systems each provided with a potential-well structure having at least one quantum well with subbands as an excitation zone which is connected on one side to a tunnel barrier zone having a potential adjacent to the excitation zone which is higher than a band edge energy of a drift zone adjacent on another side of the potential-well structure, wherein the drift zone is adjacent to a trap zone which is provided with at least one quantum-well structure containing subbands and is connected to the tunnel barrier zone of another single-layer system immediately adjacent in periodic sequence comprising an excitation zone, a drift zone, a trap zone and a tunnel barrier zone, energy levels of the subbands of the quantum-well structures inside the excitation zone and the trap zone and a thickness of the tunnel barrier zone are such that a tunneling probability exists for charge carriers to tunnel from the trap zone through the tunnel barrier zone into the excitation zone.

2. A semiconductor heterostructure radiation detector according to claim 1, wherein the excitation zone contains charge carriers having a concentration from $10_{11}$ to $10_{12}$ per cm$^2$.

3. A semiconductor heterostructure radiation detector according to claim 2, wherein the excitation zone or at least one section of the excitation zone is n-doped or p-doped.

4. A semiconductor heterostructure radiation detector according to claim 1, wherein the drift zone, trap zone and/or tunnel barrier zone are undoped.

5. A semiconductor heterostructure radiation detector according to claim 1, wherein the drift zone, trap zone and/or tunnel barrier zone are provided with a modulation doping.

6. A semiconductor heterostructure radiation detector according to claim 1, wherein the trap zone has a double or multiple quantum-well structure or a superlattice.

7. A semiconductor heterostructure radiation detector according to claim 6, wherein layer thicknesses of individual quantum-well structures are dimensioned so that the quantum wells have at least one subband or a continuum resonance at energies in a vicinity of a band-edge energy of the drift zone so that an occurrence probability of the charge carriers having the energies is maximized in the region of the trap zone.

8. A semiconductor heterostructure radiation detector according to claim 6, wherein layer thicknesses of single quantum-well structures are dimensioned so that the quantum wells have at least one subband in a range of an optical phonon energy below a band-edge energy of the drift zone.

9. A semiconductor heterostructure radiation detector according to claim 1, wherein the excitation zone has a double or multiple quantum-well structure or a superlattice.

10. A semiconductor heterostructure radiation detector according to claim 9, wherein layer thicknesses of single quantum-well structures are dimensioned so that the quantum wells have at least one subband or a continuum resonance at energies in a vicinity of band-edge energies of the drift zone so that oscillator power is maximized for optical transitions into end states having the band-edge energies.

11. A semiconductor heterostructure radiation detector according to claim 1, wherein the tunnel barrier zone comprises a homogeneous single layer.

12. A semiconductor heterostructure radiation detector according to claim 1, wherein the tunnel barrier zone has periodic superlattice having a band edge lying higher than a band edge of the drift zone.

13. A semiconductor heterostructure radiation detector according to claim 1, wherein the tunnel barrier zone comprises single layers of different material compositions.

14. A semiconductor heterostructure radiation detector according claim 1, wherein the tunnel barrier zone has thickness permitting tunneling from a bottom subband of the trap zone to a bottom subband of the excitation zone, has a thickness permitting the subbands to be localized in the trap zone and respectively in the excitation zone and do not develop hybrid states, and has a thickness reducing tunneling probability in a range of energies above a band edge of the tunnel barrier zone in order to raise emission probability in a direction of the drift zone.

15. A semiconductor heterostructure radiation detector according to claim 1, wherein the drift zone has a periodic superlattice having a band edge lying lower than a band edge of the drift zone.

16. A semiconductor heterostructure radiation detector according to claim 1, wherein the drift zone or sections thereof is doped so that an internal electric field, overlapping a course of the band edge, develops due to a relaxation of the charge carriers inserted by the doping.

17. A semiconductor heterostructure radiation detector according to claim 1, wherein the drift zone has a layer thickness between 40 to 100 nm so that the tunnel current through the drift zone is suppressed.

18. A semiconductor heterostructure radiation detector according to claim 1, wherein the excitation zone and the trap zone are provided as GaAs quantum-well structures with a bottom subband of the excitation zone lying at a lower energy than a bottom subband of the trap zone and the drift zone and the tunnel barrier zone are AlGaAs layers of different Al content with an Al content of the drift zone being lower than an Al content of the tunnel barrier zone.

19. A semiconductor heterostructure radiation detector according to claim 1, wherein the single-layer systems of the active layer are composed of GaAs, AlAs and AlGaAs single layers, with the excitation zone comprising a GasAs/AlGaAs single or multiple quantum-well structure, the drift zone comprising a homogeneous AlGaAs layer or a GaAs/AlGaAs superlattice, the trap zone being composed of a GaAs/AlGaAs single or multiple quantum well and the tunnel barrier zone comprising a homogeneous AlGaAs layer or of AlGaAs and AlAs single layers.

20. A semiconductor heterostructure radiation detector according to claim 1, wherein the single-layer systems comprising GaAs, AlGaAs and pseudomorphously warped InGaAs single layers with the excitation zone being composed of an InGaAs or a GaAs/InGaAs/AlGaAs single or multiple quantum-well structure, the drift zone comprising a homogeneous GaAs layer, the trap zone comprising a GaAs/InGaAs/AlGaAs single or multiple quantum-well and the tunnel barrier zone being comprised of a homogeneous AlGaAs layer or AlGaAs and AlAs single layers.

21. A semiconductor heterostructure radiation detector according to claim 1, wherein the single-layer systems comprise InGaAs, InAlAs and/or quarternary InAlGaAs alloys, which are lattice-adapted to lattice constants of an InP substrate, and/or are comprised of InP layers, with the excitation zone comprising an InGaAs single or multiple quantum-well structure, the drift zone comprising a homogeneous InAlGaAs or InP layer, the trap zone comprising an InGaAs single or multiple quantum-well structure, and the tunnel barrier zone comprising a homogeneous InAlAs, InP or InAlGaAs layer or plural such single layers.

22. A semiconductor heterostructure radiation detector according to claim 1, wherein the single-layer systems comprise SiGe alloy layers with a variation of a potential course being obtained by different alloy compositions.

23. A semiconductor heterostructure radiation detector according to claim 1, wherein the single-layer systems are precipitated on a substrate wafer so that the layers lie parallel to a layer surface and that above and below the layers, n-doped and p-doped layers are provided to provide electrical contact.

24. A semiconductor heterostructure radiation detector according to claim 1, wherein the tunnel barrier layers are provided at edges of the active layer.

* * * * *